(12) United States Patent
Trainor et al.

(10) Patent No.: US 11,372,462 B2
(45) Date of Patent: Jun. 28, 2022

(54) PROTECTED POWER AND DATA BUS CONNECTION OF PERIPHERAL DEVICE AND HOST DEVICE

(71) Applicant: Hitachi Energy Switzerland AG, Baden (CH)

(72) Inventors: John J. Trainor, Durham, NC (US); Russell John Taylor, Cary, NC (US)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 16/828,065

(22) Filed: Mar. 24, 2020

(65) Prior Publication Data
US 2021/0303046 A1    Sep. 30, 2021

(51) Int. Cl.
*G06F 1/26*    (2006.01)
*G06F 13/40*    (2006.01)
(Continued)

(52) U.S. Cl.
CPC .......... *G06F 1/266* (2013.01); *G06F 13/4022* (2013.01); *G06F 13/4068* (2013.01); *G06F 1/325* (2013.01); *H03K 5/133* (2013.01)

(58) Field of Classification Search
CPC .......... G06F 1/26; G06F 1/266; G06F 1/3215; G06F 1/325; G06F 13/4068; G06F 13/4077; G06F 13/4081; H03K 5/133
See application file for complete search history.

(56) References Cited

U.S. PATENT DOCUMENTS 5,473,499 A * 12/1995 Weir .................. G06F 13/4081
361/58
5,781,744 A * 7/1998 Johnson .............. G06F 13/4081
710/15

(Continued)

FOREIGN PATENT DOCUMENTS

GB          2434043 A *  7/2007  ............. H02H 11/00

OTHER PUBLICATIONS

Storr, Wayne. "The RC Charging Circuit". Electronics-Tutoriols.ws. Online Jan. 2013. Retrieved from Internet Jun. 17, 2021. <https://web.archive.org/web/20071121005157/https://www.electronics-tutorials.ws/rc/rc_1.html>. (Year: 2013).*

(Continued)

*Primary Examiner* — Thomas J. Cleary
(74) *Attorney, Agent, or Firm* — Sage Patent Group

(57) ABSTRACT

An apparatus includes a connector port configured to be selectably connected with and disconnected from a peripheral device. A detector is configured to provide an output indicating the connection of the peripheral device with the connector port with a time delay between connection of the peripheral device with the connector port and outputting the signal. A data switch is operatively coupled with the detector and a communication pin of the connector port and to selectably enable and disable data communication between the communication pin and a computer board in response to the output of the detector. A power switch is operatively coupled with the detector, the power supply pin, and a DC power supply and is configured to selectably connect and disconnect the power supply and the power supply pin in response to the output of the detector.

20 Claims, 4 Drawing Sheets

(51) Int. Cl.
*G06F 1/3234* (2019.01)
*H03K 5/133* (2014.01)

(56) References Cited

U.S. PATENT DOCUMENTS

| | | | | |
|---|---|---|---|---|
| 5,894,561 | A * | 4/1999 | Kuan | G06F 13/4081 |
| | | | | 710/302 |
| 5,910,690 | A * | 6/1999 | Dorsey | H02H 9/004 |
| | | | | 307/141 |
| 5,974,489 | A * | 10/1999 | Williams | G06F 13/4081 |
| | | | | 710/302 |
| 6,061,752 | A * | 5/2000 | Jones | G06F 13/409 |
| | | | | 710/302 |
| 6,062,480 | A * | 5/2000 | Evoy | G06F 13/4081 |
| | | | | 235/440 |
| 6,125,417 | A * | 9/2000 | Bailis | G06F 13/4081 |
| | | | | 710/302 |
| 6,572,384 | B1 * | 6/2003 | Marchevsky | G06F 13/409 |
| | | | | 439/43 |
| 6,658,507 | B1 * | 12/2003 | Chan | G06F 13/4081 |
| | | | | 710/100 |
| 9,800,233 | B1 | 10/2017 | Abu et al. | |
| 10,381,787 | B1 | 8/2019 | Bodnaruk et al. | |
| 2003/0120772 | A1 * | 6/2003 | Husain | H04L 69/40 |
| | | | | 709/224 |
| 2004/0088604 | A1 * | 5/2004 | Bland | G06F 11/221 |
| | | | | 714/43 |
| 2005/0193159 | A1 * | 9/2005 | Ng | G06F 1/26 |
| | | | | 710/302 |
| 2007/0243932 | A1 * | 10/2007 | Rothschild | G07F 17/34 |
| | | | | 463/37 |
| 2007/0255880 | A1 * | 11/2007 | Oster | G06F 13/409 |
| | | | | 710/302 |
| 2008/0165460 | A1 | 7/2008 | Whitby-Strevens | |
| 2008/0215765 | A1 | 9/2008 | Butler et al. | |
| 2010/0090644 | A1 | 4/2010 | Nokkonen et al. | |
| 2010/0328978 | A1 * | 12/2010 | Marken | H02J 3/08 |
| | | | | 363/171 |
| 2011/0163725 | A1 * | 7/2011 | Putnam | H02J 7/00036 |
| | | | | 320/137 |
| 2012/0242282 | A1 * | 9/2012 | Wada | G06F 1/266 |
| | | | | 320/107 |
| 2014/0207977 | A1 | 7/2014 | Hang et al. | |
| 2015/0137789 | A1 | 5/2015 | Furtner | |
| 2015/0324321 | A1 * | 11/2015 | Lin | G06F 9/44505 |
| | | | | 710/300 |
| 2016/0190794 | A1 | 6/2016 | Forghani-Zadeh et al. | |
| 2017/0336819 | A1 | 11/2017 | Pons | |
| 2017/0344098 | A1 | 11/2017 | Abu et al. | |
| 2017/0346240 | A1 | 11/2017 | Oporta et al. | |
| 2017/0372787 | A1 | 12/2017 | Chung et al. | |
| 2018/0341309 | A1 | 11/2018 | Sporck et al. | |
| 2020/0033924 | A1 * | 1/2020 | Waters | G06F 1/266 |

OTHER PUBLICATIONS

Storr, Wayne. "The RC Discharging Circuit". Electronics-Tutoriols.ws. Online Jan. 2013. Retrieved from Internet Jun. 17, 2021. <https://web.archive.org/web/20071121005200/http://www.electronics-tutorials.ws/rc/rc_2.html>. (Year: 2013).*

Mita, Rosario, et al. "Propagation Delay of an RC-Chain With a Ramp Input". IEEE Transactions on Circuits and Systems—II: Express Briefs. vol. 54, No. 1. 2006. IEEE. (Year: 2006).*

'Rise time' in "Wikipedia, The Free Encyclopedia". Online Jul. 19, 2017. Retrieved from Internet Jun. 17, 2021. <https://en.wikipedia.org/w/index.php?title=Rise_time&oldid=791244590>. (Year: 2017).*

Klein, Bill. "Signal Chain Basics (Part 17): Hysteresis—Understanding more about the analog voltage comparator". EE Times. Online Jul. 7, 2008. Retrieved Oct. 1, 2021. <https://www.eetimes.com/signal-chain-basics-part-17-hysteresis-understanding-more-about-the-analog-voltage-comparator/>. (Year: 2008).*

"Schottky Diode Bi-Directional Logic Level Conversion". Hobby Electronics. Online Jul. 21, 2011. Retrieved Oct. 4, 2021. <https://web.archive.org/web/20110721183353/https://www.hobbytronics.co.uk/schottky-logic-level-conversion>. (Year: 2011).*

Dunstan et al. "Universal Serial Bus Power Delivery Specification", USB Power Delivery Specification Revision 2.0, Version 1.3, Jan. 12, 2017, 574 pgs.

Dunstan et al. "Universal Serial Bus Power Delivery Specification", USB Power Delivery Specification Revision 3.0, Version 2.0 + ECNs, Feb. 7, 2020, 659 pgs. 2017.

Contributed By Digi-Keys's North American Editors, "Designing in USB Type-C and Using Power Delivery for Rapid Charging", also available at https://www.digikey.com/en/articles/techzone/2017/mar/designing-in-usb-type-c-and-using-power-delivery-for-rapid-charging, Mar. 15, 2015, 10 pgs.

International Search Report and Written Opinion of the International Searching Authority, PCT/EP2021/057492, dated Jun. 29, 2021, 13 pages.

* cited by examiner

PROTECTED POWER AND DATA BUS CONNECTION OF PERIPHERAL DEVICE AND HOST DEVICE

BACKGROUND

The present disclosure relates to apparatuses, systems, and methods of protected power and data bus connection of a peripheral device and a host device. A growing number of applications call for the provision of power and data bus connections of a peripheral device and a host device. The Universal Serial Bus (USB) set of industry standards establishes specifications for cables and connectors and protocols for connection, communication and power supply between computers and peripheral devices or other computers. USB-type connections typically provide a 5 VDC power supply pin, a ground pin, and a plurality of data pins. USB Power Delivery (USB PD) connections may provide power supply pins at higher voltages up to 20 VDC. Such connections generally require more complex and costly circuitry to accommodate higher voltages. Even with such accommodations, there remains a significant risk of damage to host devices as well as peripheral devices during connection or disconnection of peripheral and host devices. There remains an unmet need for the unique apparatuses, systems, and methods disclosed herein.

DISCLOSURE OF EXAMPLE EMBODIMENTS

For the purposes of clearly, concisely and exactly describing example embodiments of the present disclosure, the manner and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created and that the invention includes and protects such alterations, modifications, and further applications of the example embodiments as would occur to one skilled in the art.

SUMMARY OF THE DISCLOSURE

One example embodiment is a unique apparatus including a protected power and data bus connection of a peripheral device and a host device. Another example embodiment is a unique system including a protected power and data bus connection of a peripheral device and a host device. A further example embodiment is a unique method including establishing a protected power and data bus connection of a peripheral device and a host device. Further embodiments, forms, objects, features, advantages, aspects, and benefits shall become apparent from the following description and drawings.

DETAILED DESCRIPTION OF EXAMPLE EMBODIMENTS

Figure 1:
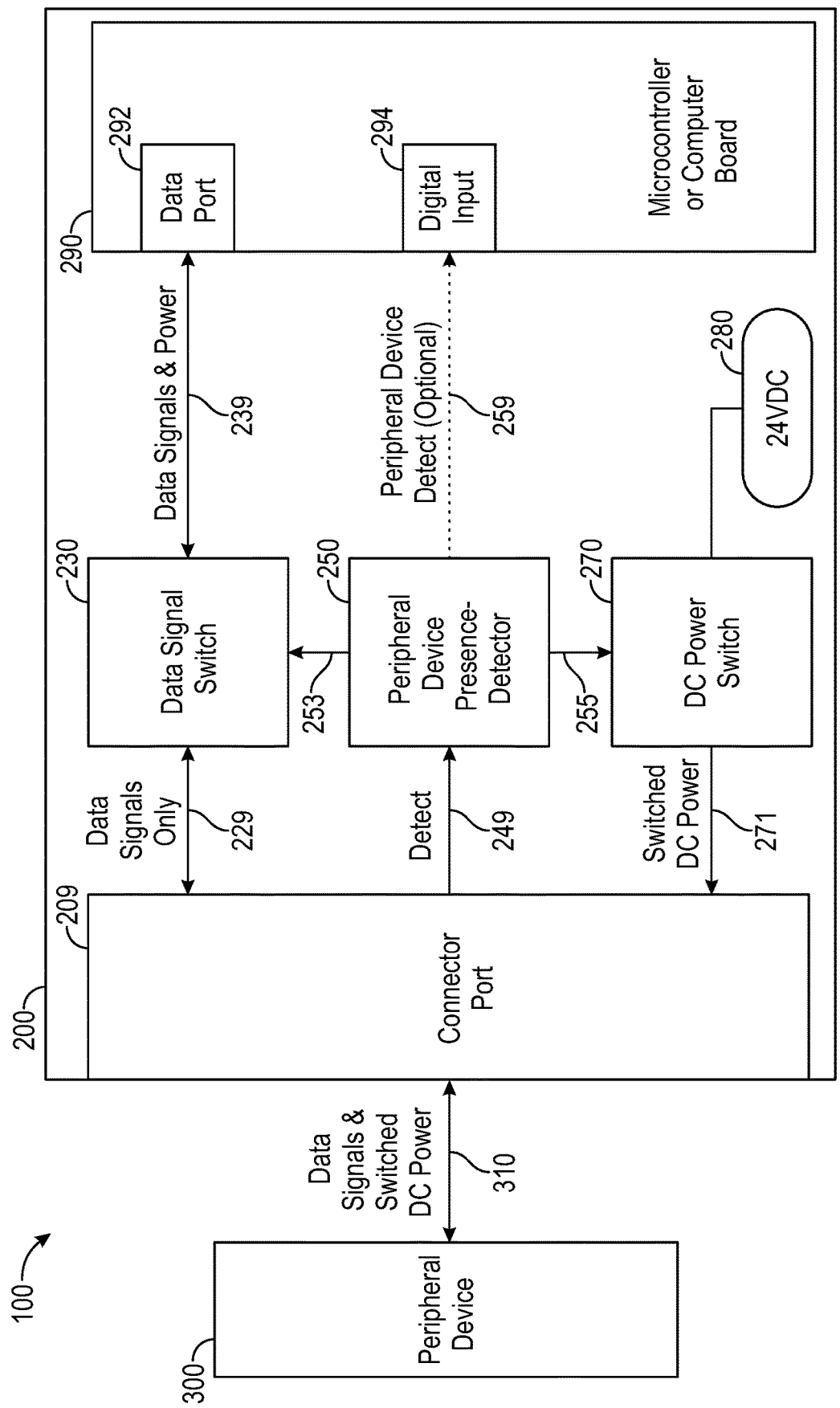
FIG. 1 is a block diagram illustrating certain aspects of an example system according to the present disclosure.

With reference to FIG. 1, there is illustrated a functional block diagram of an example system 100 including a host device 200 operatively coupled with a peripheral device 300 via a cable 310 which is plugged into a connector port 209 of the host device 200. The connector port 209 is configured to be selectably coupled to and decoupled from peripheral device 300 and to provide data communication with and power supply to the peripheral device 300. In the illustrated embodiment, peripheral device 300 is configured as a peripheral wireless communication module configured for wireless communication with one or more remote devices or networks, wired communication with host device 200 via cable 310, and to receive DC power from the host device 200 via cable 310. In other embodiments, peripheral device 300 may be another type of peripheral device configured for wired communication with host device 200 via cable 310, and to receive DC power from the host device 200 via cable 310. It shall be appreciated that the power connection from a host device according to the present disclosure, such as host device 200, may deliver higher voltages and power than a typical USB communication interface and can be utilized to provide alternative supply voltages to a peripheral device greater than those of a typical USB communication interface. In one example application, a +24 VDC power supply is provided from a host device to a peripheral device via cabling of such a length that lower voltages such as those of a typical USB communication interface are unsuitable due to voltage drop along the length of the cabling.

Host device 200 includes a connector port 209, a data signal switch 230, a peripheral device presence detector 250 (hereinafter detector 250), a DC power switch 270 (hereinafter power switch 270), and a microcontroller or computer board 290 (hereinafter board 290). In the illustrated embodiment, host device 200 is configured as an equipment control and monitoring device configured to be operatively coupled with a power grid infrastructure device such as a transformer. In other embodiments, host device 200 may be another type of computing device or single-board computer.

Power switch to 270 is operatively coupled with connector port 209 by power line 271. The power switch 270 is also coupled with power supply 280 and detector 250. In the illustrated embodiment, power supply 280 is configured as a +24 VDC power supply. In other embodiments, power supply 280 may be configured to provide other voltages such as those disclosed herein. Power switch 270 is operable to selectively switch the supply of DC power to connector port 209 on and off in response to one or more inputs received from detector 250 via line 255.

Data signal switch 230 is operatively coupled with connector port 209 via data signal lines 229 and is operatively coupled with data port 292 of board 290 via data signal and power lines 239. Data signal switch 230 is operable to selectively enable and disable data communication between connector port 209 and board 290 in response to one or more inputs received from detector 250 via line 253. The detector 250 is operatively coupled with the connector port 209 via line 251 and is optionally operatively connected with the digital input 249 of board 290 via line 259 and is operable to detect the presence or absence of a peripheral device connected to connector port 209.

Figure 2A:
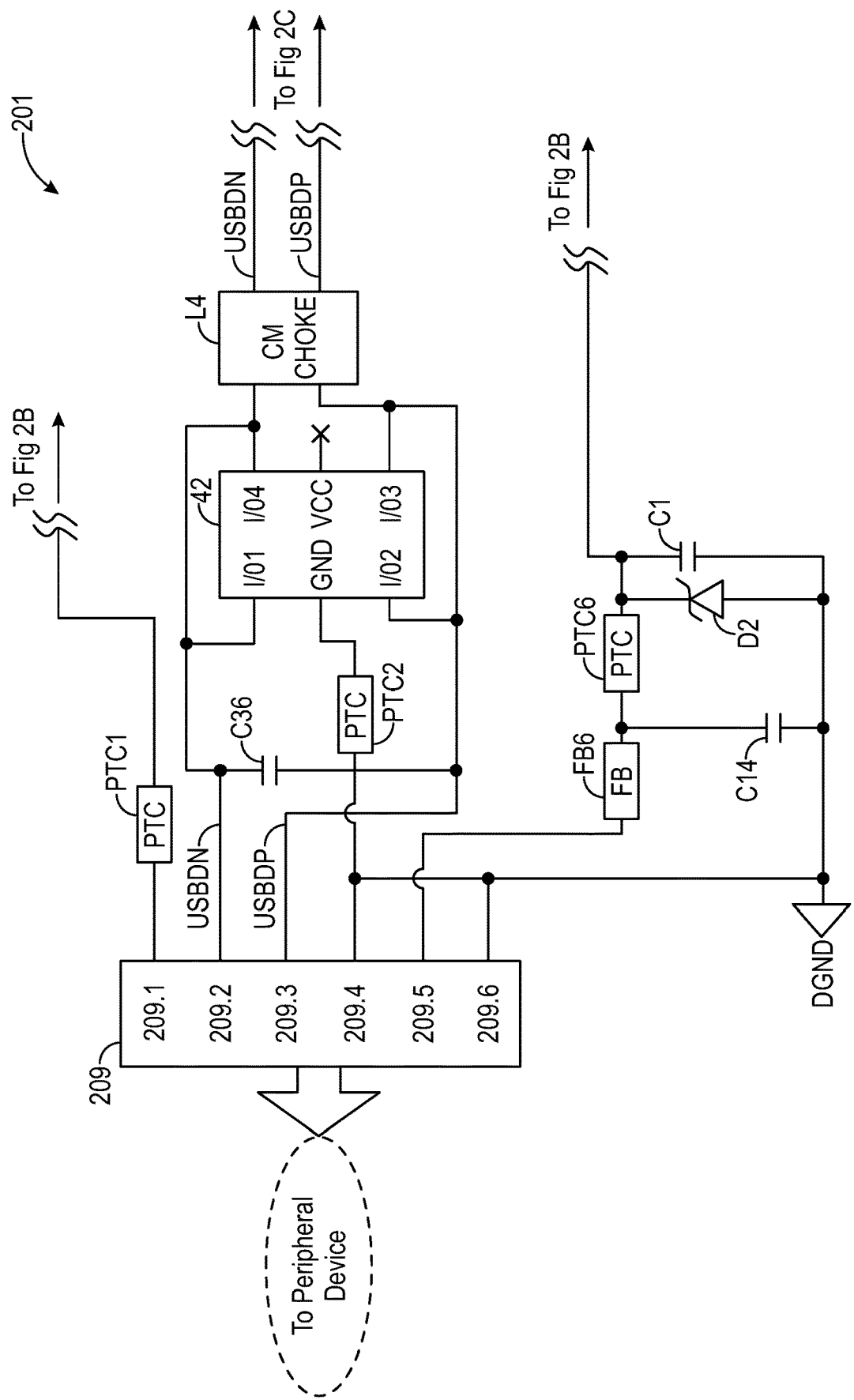
FIGS. 2A, 2B, and 2C are a circuit diagram illustrating certain aspects of an example implementation of certain elements of the system of FIG. 1.
Figure 2B:
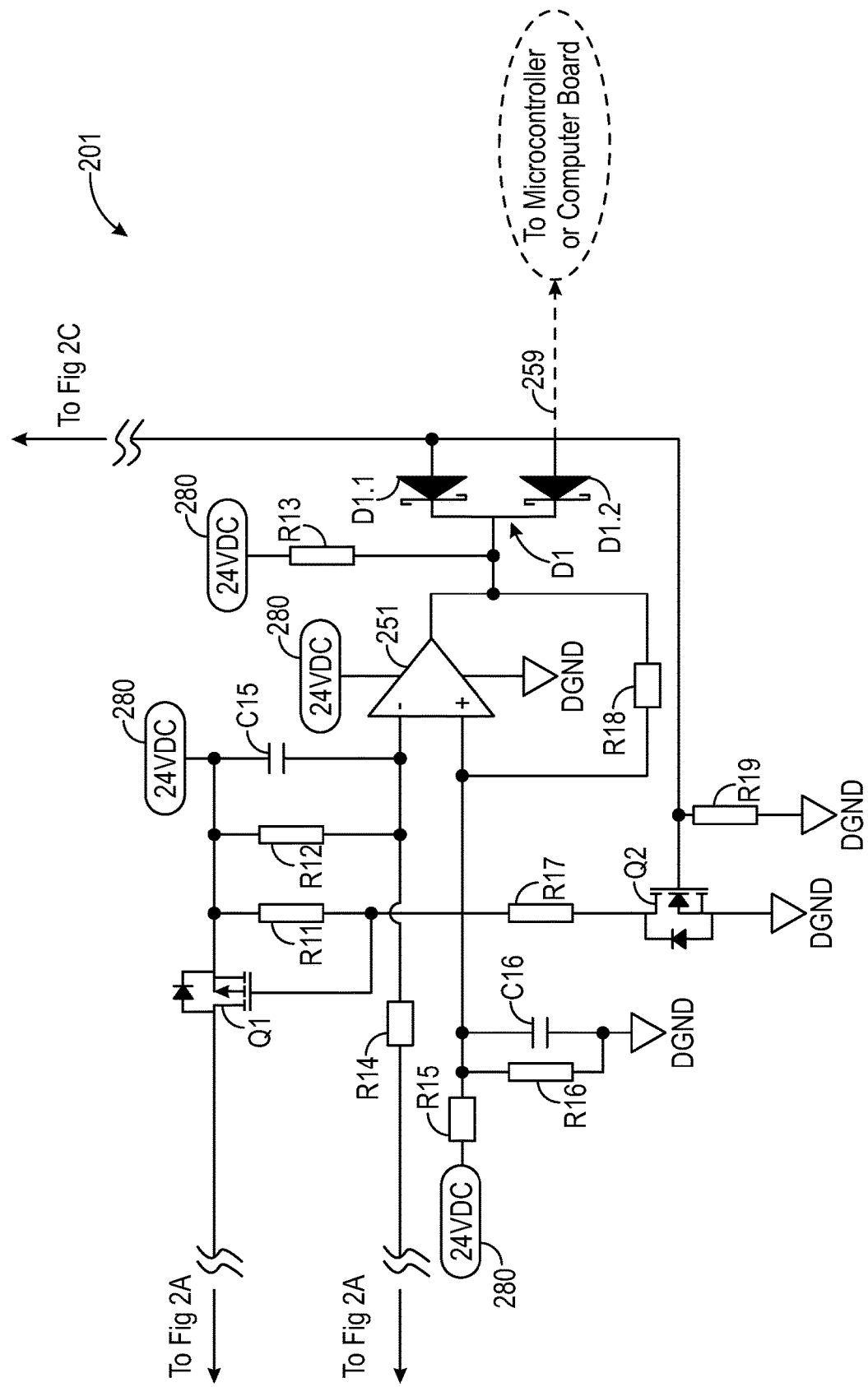
Figure 2C:
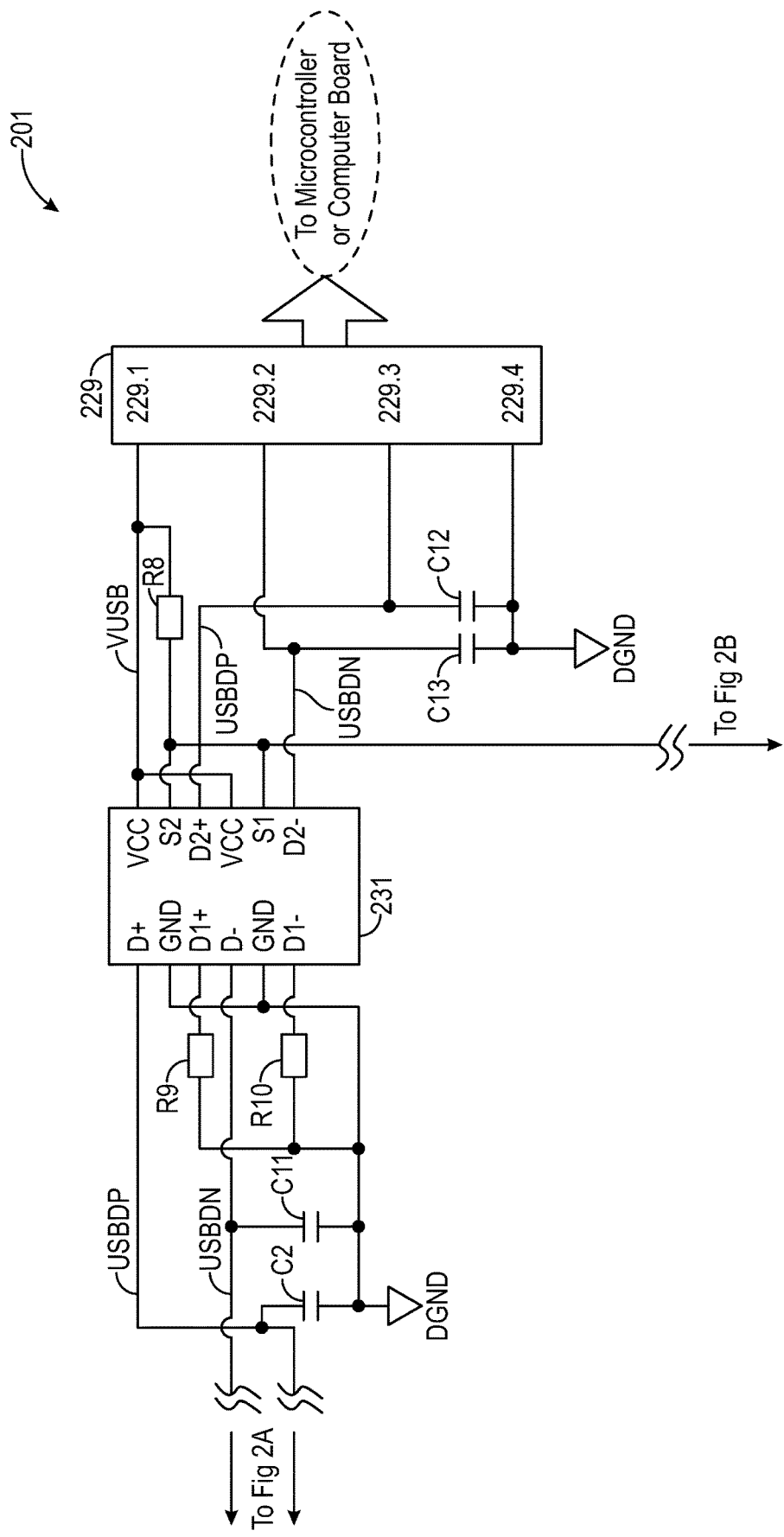

With reference to FIGS. 2A, 2B, and 2C, there is illustrated a schematic diagram of example circuitry 201 illustrating certain aspects of an example implementation of system 100. Circuitry 201 includes connector port 209 which is configured to be selectably coupled to and decoupled from a peripheral device, such as peripheral device 300 or another peripheral device, and to provide data communication with and power supply to the peripheral device. In the illustrated embodiment, connector port 209 is configured as a six-pin USB-type connector port including a peripheral detection pin 209.1, data pins 209.2 and 209.3, a power supply pin 209.5, and ground pins 209.2 and 209.6. It shall be appreciated that connector port 209 may be provided in a variety of other forms including forms with a different number of peripheral detection pins, data pins, power supply pins, and ground pins. In the illustrated embodiment, power supply pin 209.5 is selectably operably coupled with a +24 VDC power supply as further described herein. It shall be appreciated that power supply pin 209.5 may be provided in a variety of other forms selectably operably coupled with a power supply at a lesser voltage (e.g., 12 VDC) or a greater voltage (e.g., 48 VDC).

Peripheral detection pin 209.1 is connected to the negative input pin of comparator 251 via positive temperature coefficient (PTC) device PTC1 which provides overcurrent protection and a resistor R14. Capacitor C15 and resistor R12 are connected to the power supply 280 and to the negative input pin of comparator 251. Resistor R11 is connected to the power supply 280 and via resistor R17 to the gate of power MOSFET Q1. It shall be appreciated that power MOSFET Q1 is one non-limiting example of a DC power switch component and that a variety of other switching devices may be utilized in other embodiments, for example, other types of solid-state switching devices or other types of switches or switching devices. Furthermore, it shall be appreciated that comparator 251 is one non-limiting example of a detector component and that a variety of other detector components or combinations of detector components may be utilized in other embodiments, for example, other types of logic, switching, signal processing devices, or other solid-state devices. In some forms, comparator 251 implemented as a discrete integrated circuit chip. In other forms, comparator 251 may be implemented using a plurality of components or a subset of a more signal processing circuitry.

Data pin 209.2 is coupled with input/output pins I/O1 and I/O4 of small outline transistor transient voltage suppressor (TVS) U2 and to common mode choke L4. Data pin 209.3 is coupled input/output pins I/O2 and I/O3 of TVS U2 and to common mode choke L4. Capacitor C36 is coupled across data pin 209.2 and data pin 209.3. Power supply pin 209.5 is coupled to the drain pin of power MOSFET Q1 via PTC device PTC6 and ferrite bead FB6. Ground pins 209.4 and 209.6 are coupled to ground and to the ground pin of TVS U2 via PTC device PTC2. Data pin 209.2 and data pin 209.3 are configured to receive and transmit negative USB data signal USBDN and positive USB data signal USBDP, respectively.

Common mode choke L4 is coupled with pins D+ and D− of USB signal switch 231. It shall be appreciated that USB signal switch 231 is one example implementation of a data signal switch such as data signal switch 230. In other embodiments, various other types of data signal switching devices or combinations of devices may be utilized as would occur to one of skill in the art with the benefit of the present disclosure. Ground pins GND of USB signal switch 231 are coupled to ground. USB signal switch 231 further includes pin D1+ which is coupled with ground via resistor R9, and pin D1− which is coupled with ground via resistor R10. Additionally, capacitor C2 is coupled between pin D+ and ground, and capacitor C11 is coupled between pin D− and ground.

The VCC pins of USB signal switch 231 are coupled with pin 229.1 of connector port 229. Pins S1 and S2 of USB signal switch 231 are coupled with pin 229.1 of connector port 229 via resistor R8. Pin D2+ of USB signal switch 231 is coupled with pin 229.3 of connector port 229. Pin D2− of USB signal switch 231 is coupled with pin 229.2 of connector port 229. Pin 229.4 of connector port 229 is coupled with ground. Capacitor C13 is coupled to ground at one pole and to pin 229.2 and pin D2− at the other pole. Capacitor C12 is coupled to ground at one pole and to pin 229.3 and pin D2+ at the other pole. Connector port 229 is also operatively coupled with a microcontroller or computer board such as board 290.

When the negative input of the comparator 251 is at a greater voltage than the positive input of the comparator 251, the output of comparator 251 output is driven to a low state (e.g., 0.0 to +0.4 VDC). When the positive input of comparator 251 is greater than its negative input, the output of comparator 251 is high-impedance and does not control the output level of the comparator 251. Instead, resistor R13 pulls the signal at the output of the comparator up to the +24 VDC level of power supply 280.

Connecting a compatible peripheral device to connector port 209 establishes a connection between pin 209.1 and ground. This connection may be provided, for example, via an internal resistance in a connecting cable or the peripheral device connected to pin 209.1 and pin 209.6 of connector port 209 of sufficiently low impedance (e.g., 1 Kohm). In response to the connection of a compatible peripheral device, capacitor C15 discharges through resistor R14 and PTC device PTC1 causing the voltage at the negative pin of comparator 251 to decay from 24 VDC to around 12 VDC at a rate corresponding to the resistive-capacitive (RC) time constant established by resistor R14 and capacitor C15. The positive pin of comparator 251 is nominally at or about around 18 VDC due to its connection to voltage supply 280 via resistor R15 and to ground via resistor R16. The comparator 251 is optionally and preferably provided with a hysteresis to provide stability. Thus, as the voltage at the negative input to comparator 251 decreases to a sufficiently low level to overcome the hysteresis (e.g., at or about 16 VDC), the open-drain output of the comparator 251 changes from an actively driven low voltage output (established by the voltage drop from power supply 280 across resistor R13) to a higher voltage output (established by the open-drain output of comparator 251 being pulled to a higher voltage via resistor R13 in response to the voltage change at its negative input).

Reversed-biased dual common cathode Schottky diode D1 is coupled on its cathode side with the open-drain output of the comparator 251 and on its anode side with pins S1 and S2 of the USB signal switch 231 and with the gate of transistor Q2. If the cathode of diode D1 is at a lower voltage than its anode, then current will flow through diode D1 from the anode to the cathode. Thus, when the comparator is at its low state, current will flow through the diode D1 as its anode side will be at −0.35 VDC above its cathode side. Since the cathode is at the same voltage as the comparator output (0.0 to 0.4 VDC), the anode will be in the range of 0.35 to 0.75V. For the input to the USB switch, this voltage is a "low" signal. On the other hand, when the output of the comparator 251 is high impedance, the output is pulled up to nominal +24 VDC through resistor R13. The diode D1 is then reverse biased since its cathode is at a higher voltage than its anode, and no current flows through the diode D1. In this state, the anode side of the diode D1 gets pulled up through resistor R8 and inputs S1 and S2 of the USB signal switch 231 are consequently at a high state (nominal 5 VDC.)

If VUSB is on, after the open-drain output of the comparator 251 is pulled up via resistor R13 to a high voltage (e.g., 24 VDC), the voltage at the node connecting the output of diode D1 and pins S1 and S2 are pulled to a high voltage (e.g., +5 VDC) via resistor R8. The output of comparator 251 is either low (0.0 to 0.4V) or high impedance, which is effectively an open-circuit. When in a high impedance state, the output is pulled up to nominal 24 VDC via resistor R13. When the cathode side of diode D1 is pulled low, it will conduct current, pulling down the anode side of diode D1. When the cathode side of diode D1 is pulled high, it will be reverse biased with respect to its anode side and will effectively be an open-circuit. This allows resistor R8 to pull up the signals connecting to pins S1 and S2 of the USB switch 231. In response, the USB signal switch 231 is turned on and USB data communication between the peripheral device and the microcontroller or computer board is enabled. Additionally, the anode of diode D1.1 is applied to the gate of transistor Q2 which is thereby turned on. In response, the drain of Q2 goes to a low voltage, forcing a nominal 12 VDC at the gate of transistor Q1 and turning it on. With transistor Q1 turned on, the switched 24 VDC supply is enabled and connected to the peripheral device, and nominal 24 VDC is supplied to pin 209.5. If VUSB is off, the open-drain output of the comparator 251 changing to a higher voltage does not turn on the USB signal switch 231 or transistor Q1 leaving the power supply pin 209.5 effectively turned off. Reversed-biased diode D1.2 is optionally provided and is coupled on one side with the open-drain output of the comparator 251 and on the other side with the digital input 294 of board 290 or another board via line 259 effective to communicate the connection status to the board. This signal provided to digital input 259 is normally pulled high and is pulled low when the comparator 251 is turned on.

When no compatible peripheral device (e.g., no peripheral device or an incompatible peripheral device) is coupled with connector port 209, an open circuit is present at detection pin 209.1 and the negative input pin of the comparator 251 is pulled up via resistor R12 to a nominal 24 VDC. The positive pin of comparator 251 is nominally at ⅔ of 24 VDC, or around 18 VDC. With the negative pin at around 24 VDC, the open-drain output of the comparator 251 goes to (or remains at) a low voltage (e.g., 0.0 to 0.4 VDC (Vsat of output transistor)). This pulls the voltage at the node connecting diode D1 and pins S1 and S2 of the USB signal switch 231 to a low voltage (e.g., 0.35+Vsat=0.35 to 0.75 VDC) which turns off (or keeps turned off) the USO signal switch 231. When the cathode is at a high (nominal 24 VDC), diode D1 is reverse-biased and the anode of diode D1 gets pulled up to (nominal) 5 VDC. The low voltage is also provided to the gate of transistor Q2 which is turned off (or is kept off) which, in turn, turns off (or keeps turned off) transistor Q1 and disables (or keeps disabled) the switched 24 VDC to the peripheral device.

A number of example embodiments shall now be further described. A first example embodiment is an apparatus comprising a connector port configured to selectably connect with and disconnect from a peripheral device, the connector port including a power supply pin and a communication pin; a detector including an input pin operatively coupled with the connector port and an output pin, the detector configured to provide an output at the output pin in response to connection of the peripheral device with the connector port with a time delay between connection of the peripheral device with the connector port and providing the output; a data switch operatively coupled with the detector output pin and the communication pin and configured to selectably enable and disable data communication between the communication pin and a computer board in response to the output at the output pin; and a power switch operatively coupled with the detector, the power supply pin, and a DC power supply and configured to selectably connect and disconnect the power supply and the power supply pin in response to the output at the output pin.

In certain forms, of the first example embodiment a circuit node coupled with an input pin of the detector transitions from a first voltage to a second voltage in response to connection of the peripheral device with the connector port. In certain forms, the first voltage is a higher voltage (e.g. DC supply voltage) and the second voltage is a lower grounded voltage. In certain forms, the circuit node is coupled with a capacitor configured to discharge in response to connection of the peripheral device with the connector port effective to transition the circuit node from the first voltage to the second voltage. In certain forms, the time delay is proportional to a time constant of the capacitor and an associated resistor. In certain forms, the circuit node is coupled with a detection pin of the connector port. Certain forms, further comprise the peripheral device. In certain forms, connection of the peripheral device and the connector port initiates a change from the first voltage to the second voltage. In certain forms, the detector is configured as a discrete device. Certain forms, further comprise the computer board.

A second example embodiment is a system comprising: a host computer device including a connector port including a power supply pin, a communication pin, and a detection pin, a detector including an input operatively coupled with the detection pin, a data switch operatively coupled with an output of the detector and operatively coupled with the communication pin, and a power switch operatively coupled with the output of the detector, the power supply pin, and a DC power supply; and a peripheral device configured to selectably connect with the connector port; wherein connection of the peripheral device and the connector port connects the detection pin with ground, a voltage input to the detector transitions over a transition time from a first voltage to a second voltage in response to connection of the detection pin with ground, an output of the detector changes in response to transition to the second voltage changes, the data switch turns on communication with the peripheral device in response to the change in the output of the detector, and the power switch turns on power supply to the peripheral device in response to the change in the output of the detector.

In certain forms, of the second example embodiment, the transition time is established at least in part by a time constant of a capacitor and an associated resistor. In certain forms, the detector is implemented as a discrete integrated circuit chip. In certain forms, the host computer device is configured to control and monitor a power grid infrastructure device. In certain forms, the power grid infrastructure device comprises a transformer.

A third example embodiment is a method comprising: connecting a peripheral device with a connector port of a host device including connecting respective power supply pins, communication pins, and detection pins of the peripheral device and the host device; changing over a transition time an input to a detector of the host device from a first level to a second level in response to the act of connecting; changing an output of the detector in response to the changing of the input, enabling communication between a data switch of the host device and the peripheral device in response to the changing the output; and enabling a power supply from the host device to the peripheral device in response to the changing the output.

In certain forms, of the third example embodiment the transition time is established at least in part by a resistive-capacitive time constant. In certain forms, the changing of the input to the detector includes discharging a capacitor. In certain forms, the enabling communication comprises turning on the data switch. In certain forms, the enabling the power supply comprises turning on the power supply.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. An apparatus comprising:
a connector port configured to selectably connect with and disconnect from a peripheral device connection interface, the connector port including a power supply pin and a communication pin;
a detector including a comparator, the comparator including a first input pin operatively coupled with the connector port, a second input pin operatively coupled to a DC power supply via a first resistor to maintain the second input pin at a predetermined reference voltage, and a single output pin connected to the power supply via a second resistor, the first input pin configured to transition from a first input voltage higher than the predetermined reference voltage to a second input voltage lower than the predetermined reference voltage over a predetermined time delay in response to connection of the peripheral device connection interface with the connector port, the comparator configured to drive the output pin of the comparator to a low voltage output in response to the second input voltage at the first input pin of the comparator to provide an output at the output pin, the second resistor configured to pull the output pin of the comparator to a high voltage in response to the first voltage at the first input pin of the comparator;
a data switch operatively coupled with the detector output pin and the communication pin and configured to disable data communication between the communication pin and a computer board in response to the low voltage output at the output at the output pin and enable the data communication in response to the high voltage output at the output pin; and
a power switch operatively coupled with the detector, the power supply pin, and a DC power supply and configured to disconnect the power supply and the power supply pin in response to the output the low voltage output at the output pin and connect the power supply and the power supply pin in response to the high voltage output at the output pin.

2. The apparatus of claim 1 wherein a circuit node coupled with the first input pin of the detector transitions from the first input voltage to the second input voltage in response to connection of the peripheral device connection interface with the connector port.

3. The apparatus of claim 2 wherein the second input voltage is a grounded voltage.

4. The apparatus of claim 2 wherein the circuit node is coupled with a capacitor configured to discharge in response to connection of the peripheral device connection interface with the connector port effective to transition the circuit node from the first input voltage to the second input voltage.

5. The apparatus of claim 2 wherein the predetermined time delay is proportional to a time constant of the capacitor and the second resistor.

6. The apparatus of claim 2 wherein the circuit node is coupled with a detection pin of the connector port.

7. The apparatus of claim 6 further comprising the peripheral device connection interface.

8. The apparatus of claim 7 wherein connection of the peripheral device connection interface and the connector port initiates a change from the first input voltage to the second input voltage.

9. The apparatus of claim 7, wherein the peripheral device connection interface comprises a Universal Serial Bus (USB) connection interface comprising:
a peripheral detection pin operatively coupled to the first input pin;
a data pin operatively coupled to the data switch;
a power supply pin operatively coupled to the power switch; and
a ground pin operatively coupled to a grounded voltage.

10. The apparatus of claim 9, wherein the USB connection interface comprises a USB Power Delivery (USB PD) interface, wherein connection of the power supply and the power supply pin is configured to provide a power supply voltage of at least 12 VDC to the apparatus.

11. The apparatus of claim 1 wherein the detector is configured as a discrete device.

12. The apparatus of claim 1 further comprising the computer board.

13. The apparatus of claim 1, the data switch comprising a signal switch and a diode comprising a cathode connected to the output pin of the comparator and an anode connected to the signal switch, the diode configured to be forward biased in response to the low voltage output at the output pin of the comparator to disable the data communication between the communication pin and the computer board, and reverse biased in response to the high voltage output at the output pin of the comparator to enable the data communication between the communication pin and the computer board.

14. A system comprising:
a host computer device including a connector port including a power supply pin, a communication pin, and a detection pin, a detector including an input operatively coupled with the detection pin, a data switch comprising a diode including a cathode operatively coupled with a single output pin of the detector and an anode operatively coupled with the communication pin, and a power switch operatively coupled with the output pin of the detector, the power supply pin, and a DC power supply, the diode configured to be forward biased in response to a low voltage output at the output pin of the detector to disable the data communication between the communication pin and the computer board, and reverse biased in response to a high voltage output at the output pin of the detector to enable the data communication between the communication pin and the computer board; and a peripheral device connection interface configured to selectably connect with the connector port, connection of the peripheral device connection interface and the connector port configured to: connect the detection pin with ground, transition a voltage input to the detector over a predetermined transition time from a first voltage to a second voltage in response to connection of the detection pin with ground, change an output of the detector at the output pin in response to the transition to the second voltage, cause the data switch to turn on communication with the peripheral device connection interface in response to the change in the output of the detector at the output pin, and cause the power switch to turn on power supply to the peripheral device connection interface in response to the change in the output of the detector at the output pin.

15. The system of claim 14 wherein the transition time is established at least in part by a time constant of a capacitor and an associated resistor.

16. The system of claim 14 wherein the detector is implemented as a discrete integrated circuit chip.

17. The system of claim 14 wherein the host computer device is configured to control and monitor a power grid infrastructure device.

18. The system of claim 14 wherein the power grid infrastructure device comprises a transformer.

19. A method comprising:

connecting a Universal Serial Bus (USB) connection interface of a peripheral device with a USB connector port of a host device including connecting respective power supply pins, communication pins, and detection pins of the USB connection interface and the USB connector port;

changing over a predetermined transition time an input to a detector of the host device from a first level to a second level in response to the act of connecting;

changing an output of the detector at a single output pin in response to the changing of the input, enabling communication between a data switch of the host device and the USB connection interface in response to the changing the output at the output pin; and enabling a power supply from the host device to the USB connection interface in response to the changing the output at the output pin.

20. The method of claim 19 wherein the predetermined transition time is established at least in part by a resistive-capacitive time constant, and wherein changing of the input to the detector includes discharging a capacitor.

* * * * *